(12) United States Patent
Shanker et al.

(10) Patent No.: US 7,514,375 B1
(45) Date of Patent: Apr. 7, 2009

(54) PULSED BIAS HAVING HIGH PULSE FREQUENCY FOR FILLING GAPS WITH DIELECTRIC MATERIAL

(75) Inventors: Sunil Shanker, Santa Clara, CA (US); Chi-I Lang, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 213 days.

(21) Appl. No.: 11/500,799

(22) Filed: Aug. 8, 2006

(51) Int. Cl.
*H01L 21/31* (2006.01)
*H01L 21/469* (2006.01)

(52) U.S. Cl. ............... 438/788; 438/789; 257/E21.274; 257/E21.49; 427/255.37

(58) Field of Classification Search ............... 438/788, 438/789, 790; 257/E21.274, E21.279, E21.49; 427/255.37
See application file for complete search history.

(56) References Cited

U.S. PATENT DOCUMENTS

| 5,723,386 | A | 3/1998 | Ishikawa |
| 6,020,458 | A * | 2/2000 | Lee et al. ............. 528/401 |
| 6,030,881 | A | 2/2000 | Papasouliotis |
| 6,335,261 | B1 | 1/2002 | Natzle |
| 6,376,391 | B1 | 4/2002 | Olson |
| 7,030,045 | B2 * | 4/2006 | Johnson ............... 438/788 |
| 7,160,821 | B2 * | 1/2007 | Huang et al. ........... 438/790 |

* cited by examiner

*Primary Examiner*—Caridad M Everhart
(74) *Attorney, Agent, or Firm*—Thomas Swenson

(57) ABSTRACT

During bottom filling of high aspect ratio gaps and trenches in an integrated circuit substrate using HDP-CVD, a pulsed HF bias is applied to the substrate. In some embodiments, pulsed HF bias is applied to the substrate during etching operations. The pulsed bias typically has a pulse frequency in a range of about from 500 Hz to 20 kHz and a duty cycle in a range of about from 0.1 to 0.95.

27 Claims, 10 Drawing Sheets

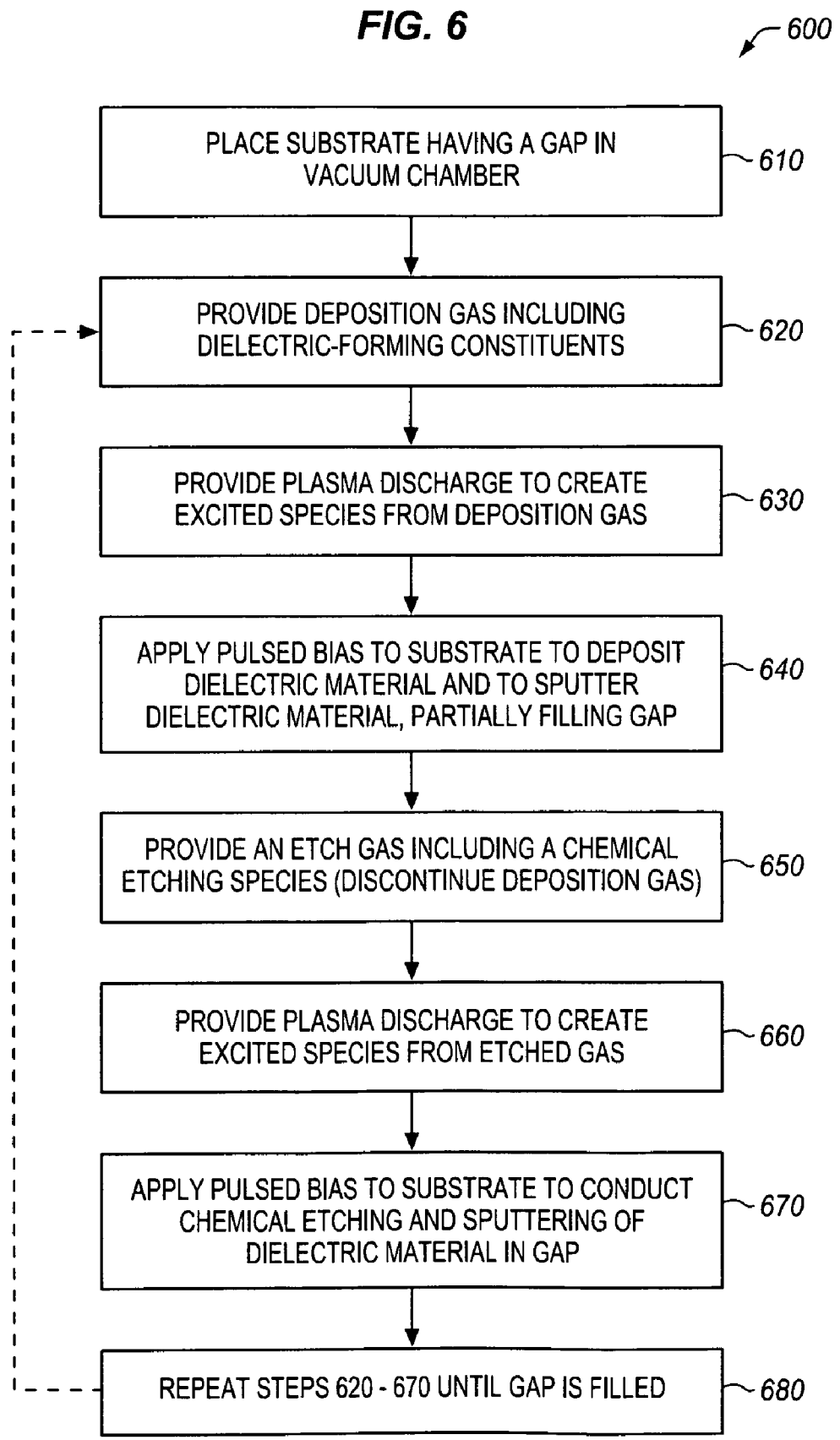

PULSED BIAS HAVING HIGH PULSE FREQUENCY FOR FILLING GAPS WITH DIELECTRIC MATERIAL

FIELD OF THE INVENTION

The invention relates to a method for forming dielectric insulator material in high aspect ratio gaps of integrated circuits.

BACKGROUND OF THE INVENTION

As semiconductor technology advances, circuit elements and interconnections on wafers or silicon substrates become increasingly more dense. As a result of the continuing trend toward higher device densities, parasitic interdevice currents are increasingly problematic. In order to prevent unwanted interactions between circuit elements, insulator-filled gaps, or trenches, located between active circuit devices and metallized interconnect layers are provided to physically and electrically isolate the elements and conductive lines. However, as circuit densities continue to increase, the widths of these gaps decrease, thereby increasing gap aspect ratios, typically defined as the gap depth divided by the gap width. As the gaps become narrower, parasitic capacitance increases, and filling the gaps with insulating material becomes more difficult. This can lead to unwanted voids and discontinuities in the insulating, or gap-fill, material.

For example, in metal-oxide-semiconductor ("MOS") technology, it is necessary to provide an isolation structure that prevents parasitic channel formation between adjacent devices, such devices being primarily NMOS and PMOS transistors or CMOS circuits. Trench isolation technology has been developed in part to satisfy such insulation needs. Refilled trench structures essentially comprise a recess formed in the silicon substrate that is refilled with a dielectric insulating material. Such structures are fabricated by first forming submicron-sized trenches in the silicon substrate, usually by a dry anisotropic etching process. The resulting trenches typically display a steep side-wall profile. The trenches are subsequently refilled with a dielectric, such as silicon dioxide, typically by a chemical vapor deposition ("CVD") technique. They are then planarized by an etchback process so that the dielectric remains only in the gap, its top surface level with that of the silicon substrate. The resulting filled-trench structure functions as a device isolator having excellent planarity and potentially high aspect ratio beneficial for device isolation. Refilled trench isolation can take a variety of forms depending upon the specific application; they are generally categorized in terms of the trench dimensions: shallow trenches (<1 µm), moderate depth trenches (1 µm to 3 µm), and deep, narrow trenches (>3 µm deep, <2 µm wide). Shallow Trench Isolation (STI) is used primarily for isolating devices of the same type in increasingly dense MOS circuits. STI provides a high degree of surface planarity.

Similar isolation techniques are used to separate closely spaced circuit elements that have been formed on or above a semiconductor substrate during integrated circuit fabrication. The circuit elements may be active devices or conductors, and are isolated from each other by refilled "gaps".

The basic trench, or gap, isolation process is, however, subject to drawbacks, one of these being void formation in the gap during dielectric gap fill. Such voids are formed when the gap-filling dielectric material forms a constriction near the top of the gap, preventing deposition of the material into the gap interior. Such voids compromise device isolation, as well as the overall structural integrity. Unfortunately, preventing void formation during gap fill often places minimum size constraints on the gaps themselves, which may compromise device packing density or device isolation.

Silicon dioxide is formed by conventional CVD techniques by mixing a gaseous oxidizer (e.g., $N_2O$), silane ($SiH_4$) and inert gases, such as argon, and energizing the mixture in a reactor so that the oxygen and silane react to form silicon dioxide on a wafer substrate. Plasma-enhanced chemical vapor deposition ("PECVD") processes are used to fill gaps with silicon oxide material. In PECVD processes, a plasma of ionized gas is formed in the CVD plasma reactor. The plasma energizes the reactants, enabling formation of the desired silicon dioxide at lower temperatures than would be possible by adding only heat to the reactor system. In a typical plasma-enhanced CVD ("PECVD") process, the plasma is a low pressure reactant gas discharge that is developed in a radio-frequency ("RF") field. The plasma is an electrically neutral ionized gas in which there are equal number densities of electrons and ions. At the relatively low pressures used in PECVD, the electron energies can be quite high relative to heavy particle energies. The high electron energy increases the density of dissociated reactants within the plasma available for reaction and deposition at the substrate surface. The enhanced supply of reactive free radicals in the PECVD reactor enables the deposition of dense, good quality films at lower temperatures (e.g., 400° C.) and at faster deposition rates (30 nm/min to 40 nm/min) than typically achieved using only thermally-activated CVD processes (10 nm/min to 20 nm/min). Nevertheless, the gap-fill capabilities of PECVD techniques do not extend beyond aspect ratios of about 2.

Design feature widths of integrated circuit devices are currently approaching 0.1 µm, or 100 nm. To achieve corresponding overall circuit density, gap dimensions of approximately 25 nm to 300 nm gap width range and 100 nm to 1000 nm gap depth range are desired, having a corresponding range of aspect ratios of 2 to 6. Furthermore, because the gap is so thin, the insulating gap material should have a dielectric constant of 3.3 or less. A gap opening of 500 nm or less is too small for depositing material using conventional CVD and PECVD methods. Also, as the deposition of gap-filling material proceeds, the gap opening becomes smaller, making it more difficult to fill and creating the risk of void formation.

Currently, high density plasma ("HDP") CVD is used to fill high aspect ratio gaps. In an HDP-CVD process, RF bias is applied to a wafer substrate in a vacuum chamber. As a result, the flux of deposition precursors is perpendicular the wafer, and film growth tends to occur perpendicularly to the bottom of the feature, rather than on feature sidewalls. Thus, HDP-CVD is not an entirely diffusion-based (isotropic) process. Typical HDP-CVD processes use a gas mixture containing oxygen, silane, and inert gases, such as argon, to achieve simultaneous dielectric deposition and sputtering. Some of the gas molecules, particularly argon, are ionized in the plasma and accelerate toward the wafer surface when the RF bias is applied to the substrate. Material is thereby sputtered when the ions strike the surface.

HDP-CVD processes operate at a pressure regime several (two to three) orders of magnitude lower than that of PECVD processes. Also, using HDP-CVD, it is usually possible to deposit silicon oxide films at lower temperatures (e.g., 150° C. to 250° C.) than in a PECVD process. In an HDP reactor, power is coupled inductively to the plasma, resulting in higher plasma density. Consequently, in an HDP reactor, because of the pressure and plasma characteristics, species impinging on the depositing film surface are much more energetic than in a PECVD reactor, such that gas-solid collisions typically result in sputtering of the deposited film. In an HDP-CVD deposition process, the sputter component is typically between 10% and 20% of the net deposition rate. Another characteristic of HDP-CVD deposition is that increased bias power applied to the wafer results in an increased in situ sputter component, thereby decreasing the deposition rate.

In a HDP-CVD process, dielectric material deposited on the wafer surface is simultaneously sputter-etched, thereby helping to keep gaps open during the deposition process, which allows higher aspect ratio gaps to be filled.

Nevertheless, a problem often encountered in HDP-CVD processes is the deposition of more material on the upper region of a gap sidewall than on the lower region of the gap. High aspect ratio gaps often exhibit reentrant features, which make filling even more difficult. The most problematic reentrant feature is a narrowing at the top of the gap. Thus, the deposited dielectric material slopes inward near the top of the gap. For a given AR, this increases the ratio of gap volume to gap access area seen by the precursor species during deposition. Hence, voids and seams become even more likely. The formation of cusps in the upper region or at the entrance of a gap, also called "overhang", typically results from the non-directional deposition reactions of neutral species in the plasma reactor and from sputtering/re-deposition processes. The directional aspect of deposition processes produces high momentum charge species that sputter away bottom fill. The sputtered material tends to re-deposit on the side walls. Thus, in conventional HDP-CVD processes, cusp formation at the entry region of high aspect ratio gaps to be filled cannot be totally eliminated because sputtering and re-deposition reactions are inherent to the physics and chemistry of a conventional HDP-CVD process.

FIG. 1 depicts schematically a cross-sectional view 100 of a high aspect ratio gap 102 partially filled with dielectric material 104 using a conventional HDP-CVD process. As depicted in FIG. 1, the conventional HDP-CVD process provided bottom filling of the bottom 106 of gap 102 in substrate 107. Sputtered dielectric material, however, re-deposited on the side walls 108 of gap 102, particularly at gap opening 110. As a result, overhanging dielectric material 112 prematurely closed gap opening 110 before gap 102 was completely filled, resulting in formation of void 114. The dielectric material deposited in 102 also includes a weak spot 116. Weak spots form as a result of increased ratio of gap volume to gap access area as the amount of undesired overhang increases during bottom filling. Weak spots typically lead to formation of voids and seams. Also, compared to the thickness of deposited dielectric material filling of the bottom of 102, the amount of dielectric material 104 deposited in the field areas 120 of substrate 107 is excessive.

Thus, there is a need for a method of depositing gap-filling dielectric material for filling an insulator gap, or a trench, having an aspect ratio of 2 or greater.

SUMMARY OF THE INVENTION

The invention provides a novel method for depositing a dielectric thin film in integrated circuit applications, particularly in STI (shallow trench isolation) and gap-filling operations. The invention may be used to deposit a premetal dielectric layer ("PMD"), an intermetal dielectric layer ("IMD"), an interlayer dielectric layer ("ILD"), a passivation layer and other insulator thin films having a low dielectric constant in an integrated circuit. A method in accordance with the invention is especially useful to deposit a thin film of dielectric material, such as doped or undoped silicon oxide, in a high aspect ratio ("AR") gap, or trench, between active devices or conductive interconnects in high density integrated circuits. Thus, methods in accordance with the invention are utilized for shallow trench isolation ("STI") and other aggressive gap fill applications, in which closely spaced, narrow gaps (trenches) are filled with low dielectric constant material. A method employing HDP-CVD in accordance with the invention is useful to fill high AR isolator gaps; for example, gaps having a gap width in the range of from 25 nm to 300 nm and an aspect ratio in the range of from 2 to 6.

A basic embodiment of a method in accordance with the invention for filling a gap with dielectric material by HDP-CVD during integrated circuit fabrication comprises: providing in a vacuum chamber a substrate containing a gap; providing a process gas including dielectric-forming constituents; providing a plasma discharge to create in the vacuum chamber excited species from the process gas; and applying a bias to the substrate, thereby depositing dielectric material in the gap to fill partially the gap and simultaneously sputtering dielectric material in the gap. Applying a bias to the substrate includes applying a pulsed bias to the substrate. The pulsed bias has a pulse frequency not less than about 150 Hz, and the pulses of the pulsed bias have a duty cycle. In some embodiments, the pulse frequency has a frequency in a range of about from 0.5 kHz to 20 kHz. In some embodiments, duty cycles of the pulsed bias have a value in a range of about from 0.1 to 0.9. In some embodiments, the pulsed bias comprises high-frequency radio frequency (HF-RF) bias. In some embodiments, the process gas comprises silicon atoms and oxygen atoms. In some embodiments, the process gas further comprises hydrogen gas. In some embodiments, the process gas further comprises a noble gas. In some embodiments, the process gas further comprises a chemical etch gas. In some embodiments, the gap has an aspect ratio greater than 3. In some embodiments, the gap has a gap width in a range of about from 30 nm to 50 nm, and a gap depth in a range of about from 300 nm to 450 nm. In some embodiments, providing a plasma discharge comprises applying a substantially continuous radio frequency to a plasma-forming gas to generate a plasma.

Another basic embodiment of a method in accordance with the invention for filling a gap with dielectric material by HDP-CVD during integrated circuit fabrication includes a deposition stage followed by an etch, which are typically repeated until deposition is complete. Initially, a substrate containing a gap is located in a vacuum chamber. A deposition stage typically comprises: providing a deposition gas including dielectric-forming constituents; providing a plasma discharge to create in the vacuum chamber excited species from the deposition gas; applying a bias to the substrate, thereby depositing dielectric material in the gap to fill partially the gap and simultaneously sputtering dielectric material in the gap. Thereafter, an etch stage includes: providing an etch gas; providing a plasma discharge to create excited species in the vacuum chamber from the etch gas, thereby etching a portion of dielectric material in the gap; applying a bias to the substrate, thereby sputtering dielectric material in the gap. Applying a bias in the deposition stage and in the etch stage comprises applying a pulsed bias to the substrate. The pulsed bias has a pulse frequency not less than about 150 Hz. The pulses of the pulsed bias have a duty cycle. In some embodiments in accordance with the invention, the deposition gas comprises silicon atoms and oxygen atoms. In some embodiments, the deposition gas further comprises a noble gas. In some embodiments, the etch gas does not include components for substantially forming dielectric material. In some embodiments, the etch gas comprises dielectric-forming constituents. In some embodiments, the etch gas comprises components substantially for physically sputtering dielectric material, and the etch gas does not include a chemical etching species. In some embodiments, the etch gas comprises both a chemical etching species and one or more other species that do not result in chemically reactive species, but instead principally physically sputter dielectric material. In some embodiments, the etch gas includes a halogen-containing compound. In some embodiments, the etch gas includes a fluorine-containing compound. In some embodiments, the etch gas includes a noble gas.

Other features of embodiments in accordance with the invention are described in more detail below.

BRIEF DESCRIPTION OF THE DRAWINGS

FIG. 6 contains a process flow diagram of an embodiment of a generalized method in accordance with the invention for depositing a dielectric material in a high AR gap of an integrated circuit substrate using a sequence including HDP-CVD deposition followed by an etch stage including chemical etching;

DETAILED DESCRIPTION OF THE INVENTION

Figure 1:
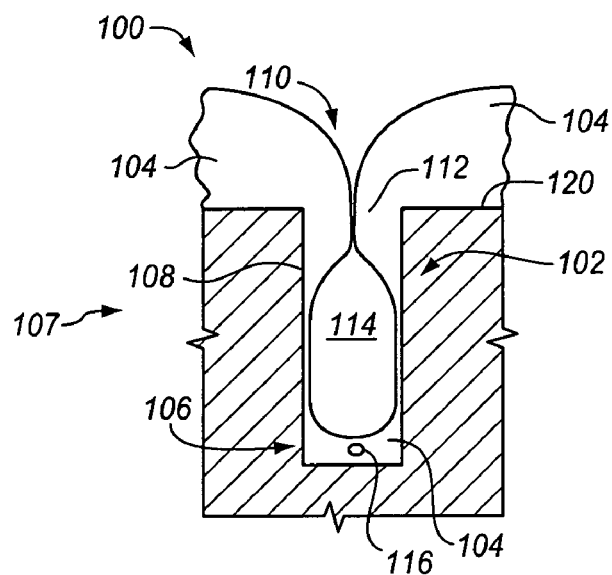
FIG. 1 depicts schematically a cross-sectional view of a high aspect ratio gap partially filled with dielectric material using a conventional HDP-CVD process of the prior art.

The invention is described herein with reference to FIGS. 2-8. It should be understood that the FIGS. 2, 5, 7-8, depicting integrated circuit substrates in various stages of gap filling, are not meant to be actual plan or cross-sectional views of any particular portion of an actual integrated circuit device. In the actual devices, the layers will not be as regular and the thicknesses may have different proportions. The various layers in actual devices often are curved and possess overlapping edges. The figures s instead show idealized representations which are employed to explain more clearly and fully the method of the invention than would otherwise be possible. Also, the figures represent only one of innumerable variations of devices, structures and substrates that could be processed using methods in accordance with the invention. Furthermore, processes are described in the specification with reference to FIGS. 2-8; nevertheless, it is clear that methods in accordance with the invention can be practiced using structures, apparatuses and fabrication processes very different from those of FIGS. 2-8. The preferred embodiments described herein are exemplary and are not intended to limit the scope of the invention, which is defined in the claims below.

For the sake of clarity and ease of understanding, in some of the figures which follow, identical reference numerals are used to designate the same or similar structures and elements.

Terms of orientation, such as "above", "top", "upper", "below", "bottom" and "lower" herein, mean relative to the flat, horizontal direction of a wafer substrate, such a substrates 202, 318, 722, and 822 in FIGS. 2, 3, 7B and 8B, respectively. The flat dimension of a substrate defines a substrate plane that is considered to be a "horizontal" plane herein, and directions perpendicular to this plane are considered to be "vertical".

The term "thin film" is used herein as it is used in the integrated circuit art. Generally, it means a film of less than a micron in thickness. Typically, the gaps filled in accordance with the invention have a width of about 25 nm to 500 nm, and a depth up to 5000 nm.

The term "trench", as used in the art, usually denotes a recess in a semiconductor substrate, typically formed by etching. The term "gap", as used in the art, sometimes refers to a spacing between circuit elements on or above a semiconductor layer. In this specification, the term "gap" is generally used synonymously with the term "trench". Embodiments in accordance with the invention are used to fill both trenches and gaps. This specification usually refers to filling "gaps" in applying a method and precursors of the invention. Nevertheless, it should be understood that the invention, as described in the claims, is equally applicable for filling trenches. In this specification, therefore, the term "gap" is used to include both trenches and gaps.

The words "etch" and "etching" are used broadly in this specification to refer generally to methods and techniques of removing material from an integrated circuit substrate, including sputter etching and chemical etching techniques. The terms "sputter", "sputter etching", "physical sputtering" and related terms refer to substantially physical, non-reactive (non-chemical) etching techniques. The terms "chemical etching", "reactive etching" and related terms refer to etching techniques that are substantially reactive, or chemical. Chemical etching techniques are often used in the art to effect isotropic etching.

Figure 2A:
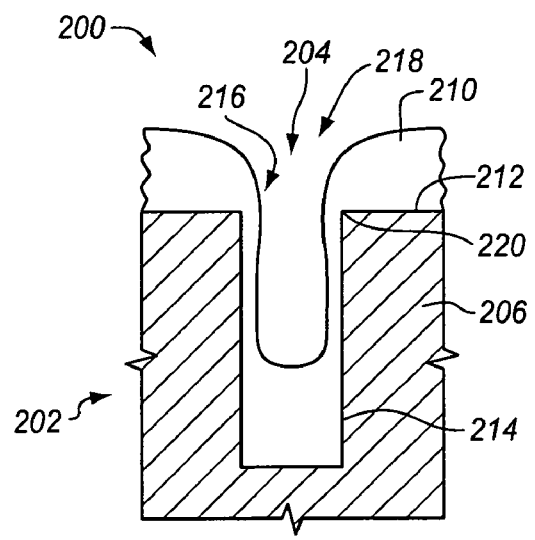
FIG. 2A is a cross-sectional view of a section of an integrated circuit substrate at an intermediate stage of fabrication during gap filling in accordance with the invention.
Figure 2B:
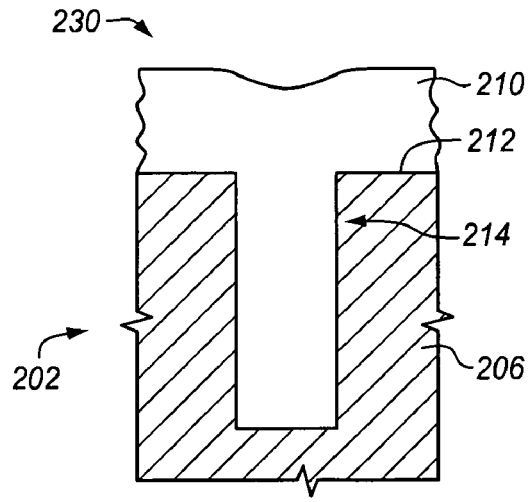
FIG. 2B depicts the substrate of FIG. 2A in a further intermediate stage of fabrication in which dielectric material has completely filled a high AR.gap through bottom filling in accordance with the invention.

FIG. 2A is a cross-sectional view 200 of a section of an integrated circuit substrate 202 at an intermediate stage of fabrication during gap filling in accordance with the invention. Substrate 202 has a high AR gap 204 in a base layer 206. Base layer 206 typically comprises doped or undoped semiconductor material, such as polycrystalline silicon. In some applications, base layer 206 essentially comprises a layer of metal features having gaps between them that are to be filled with insulating dielectric material. In still other applications base layer 206 comprises dielectric material that is different from the dielectric material to be deposited in gap 204. FIG. 2A depicts dielectric material 210 deposited on substrate 202. As a result of bottom filling of high AR gap 204 in accordance with the invention, the thickness of dielectric material in the field area 212 of base layer 206 is comparable to the thickness of dielectric material filling the bottom 214 of gap 204. Pulsed biasing in accordance with the invention substantially inhibited re-deposition of sputtered dielectric material in gap 204. As a result, there is insubstantial overhang 216 of dielectric material at opening 218 at top 220 of gap 204. Also, the absence of overhanging dielectric material at the top of the gap means an unfavorable increase of the ratio of the gap of volume to the area of opening 218 (i.e., to the gap access area seen by excited species entering the gap during deposition) has not occurred. As a result, no weak spots are present in the deposited dielectric material in gap 204. FIG. 2B depicts substrate 202 in a further intermediate stage of fabrication in which dielectric material 210 has completely filled high AR.gap 214 through bottom filling in accordance with the invention.

Figure 3:
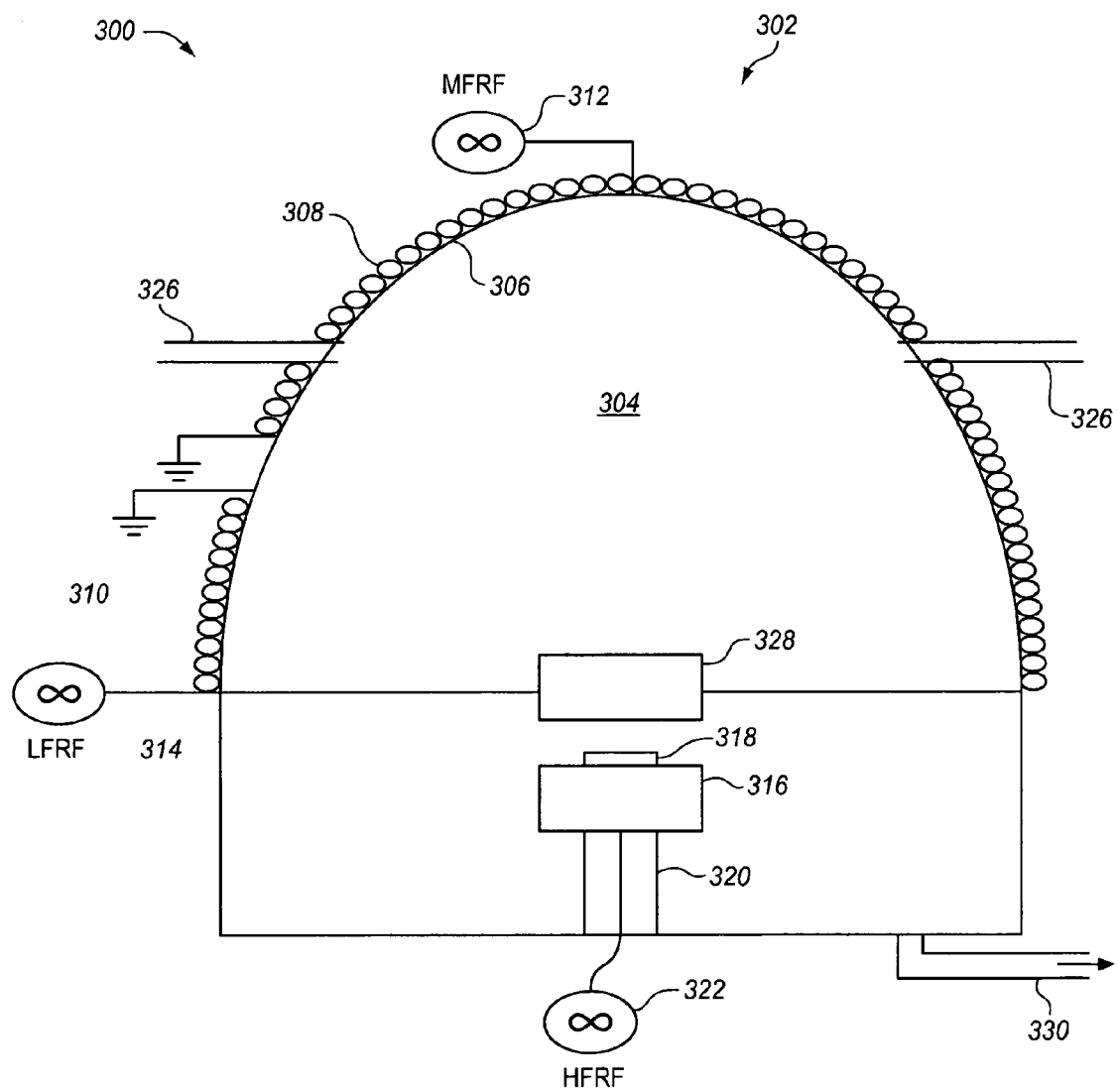
FIG. 3 depicts schematically a cross-sectional view of a HDP-CVD apparatus operable to conduct deposition of dielectric material in accordance with the invention.

Generally, standard HDP-CVD systems are suitable for conducting deposition of dielectric material in accordance with the invention. Examples of HDP-CVD systems and methods are described in U.S. Pat. No. 6,787,483, issued Sep. 7, 2004, to Bayman et al., in U.S. Pat. No. 6,376,391, issued Apr. 23, 2002, to Olson et al., in U.S. Pat. No. 6,030,881, issued Feb. 29, 2000, to Papasouliotis et al., and in U.S. Pat. No. 5,605,599, issued Feb. 25, 1997, to Benzing et al., which are hereby incorporated by reference as if fully contained herein. FIG. 3 depicts schematically a cross-sectional view 300 of a HDP-CVD reactor system 302 operable to conduct deposition of dielectric material in accordance with the invention.

As depicted in FIG. 3, system 302 includes a process vacuum chamber 304, which encloses other components of the reactor system and serves to contain the plasma. In some embodiments, the vacuum chamber walls 306 are made from aluminum, aluminum oxide, and/or other suitable material. The embodiment shown in FIG. 3 has two plasma sources: top RF coil 308 and side RF coil 310. Top RF coil 308 is a medium frequency or MF-RF coil and side RF coil 310 is a low frequency or LF-RF coil. In the embodiment shown in FIG. 3, MF-RF source 312 is operable to supply MF-RF energy at a frequency typically in a range of about from 430 kHz to 470 kHz. LF-RF source 314 is operable to supply LF-RF energy at a frequency typically in a range of about from 340 kHz to 370 kHz. Nevertheless, the invention is not limited to operation in reaction chambers with dual sources, nor RF plasma sources. Any suitable plasma source or sources may be used.

Within vacuum chamber 304, a wafer pedestal 316 supports a substrate 318 having one or more gaps to be filled. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 320 for supplying heat transfer fluid controls the temperature of substrate 318. The wafer chuck and heat transfer fluid system facilitate maintaining the appropriate wafer temperatures.

A HF-RF source 322 serves to bias electrically substrate 318 and draw positive ions to the substrate. Electrical energy from source 322 is coupled to substrate 318; for example, via an electrode or capacitive coupling. HF-RF source 322 generally is operable to supply RF energy having a frequency in a range of about from 1 MHz to 20 MHz, typically 13.6 MHz. In some embodiments, HF-RF source 322 has an internal dc bias control that allows a regulated bias voltage at the wafer to be achieved. A key feature is that HF-RF source 322 is operable to turn the bias applied to the substrate on and off periodically in a pulse-like manner. In some embodiments, HF-RF source 322 also is operable to vary the bias magnitude in a desired controlled fashion. Note that the bias applied to the substrate need not be an RF bias. Other frequencies and DC bias are suitable as well.

One or more process gases are introduced via one or more inlets 326. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 328, which may or may not direct the gases toward the substrate surface. In some embodiments, injectors are connected to primary gas ring 328 to direct at least some of the gases or gas mixtures into chamber 304 and toward substrate 318. Note that injectors, gas rings or other mechanisms for directing process gas toward the wafer are not critical to this invention. The sonic front caused by a process gas entering the chamber typically causes the gas to rapidly disperse in all directions—including toward the substrate. Exhaust gases including material sputtered and etched from the substrate exit chamber 304 via an outlet 330. A vacuum pump (e.g., a turbomolecular pump) typically draws process gases out and maintains a suitably low pressure within the reactor.

Figure 4:
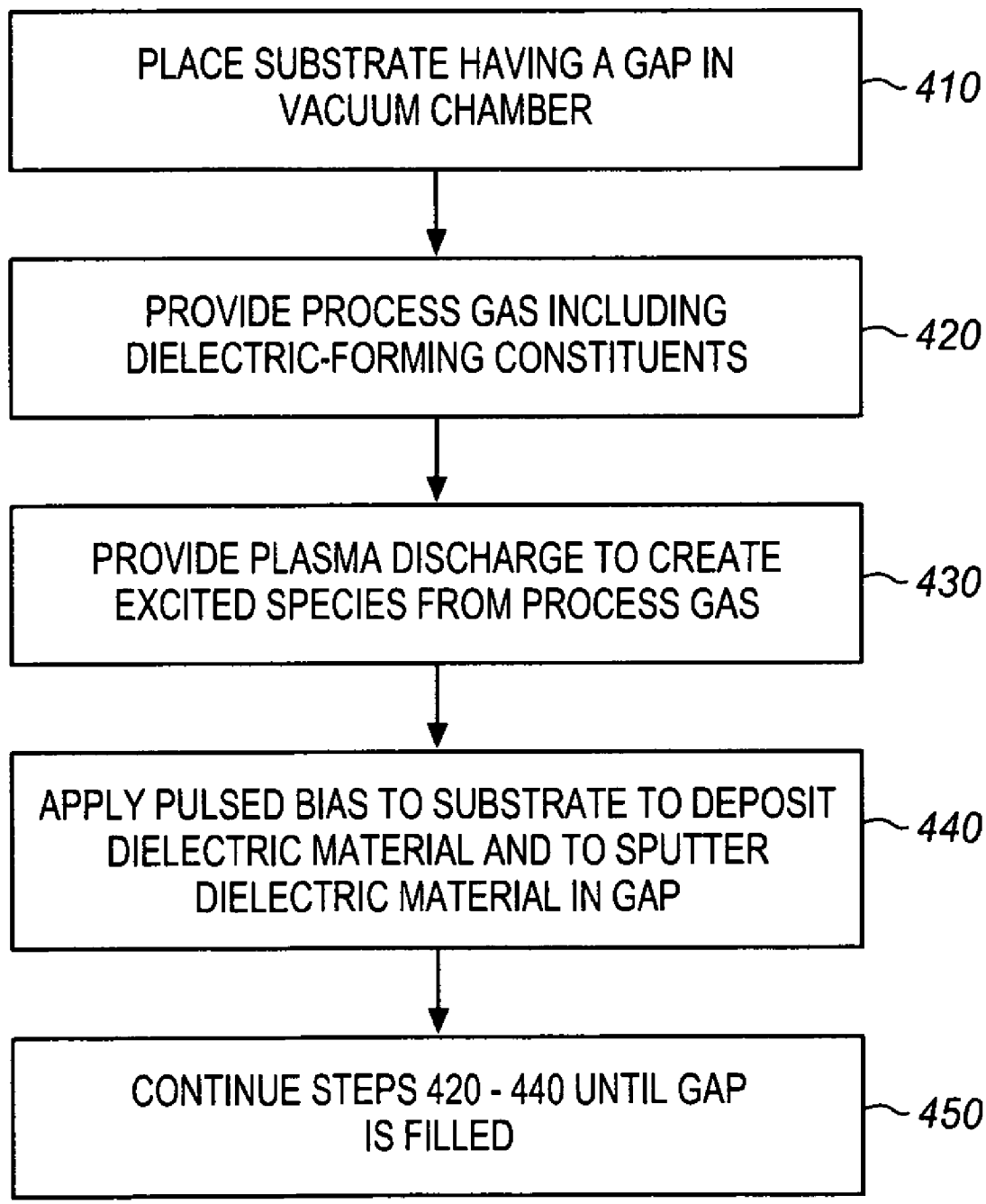
FIG. 4 contains a process flow diagram of an embodiment of a generalized method in accordance with the invention for depositing dielectric material in a high aspect ratio gap of an integrated circuit substrate.

FIG. 4 contains a process flow diagram of an embodiment of a generalized method 400 in accordance with the invention for depositing dielectric material in a high aspect ratio gap of an integrated circuit substrate. Method 400 is described herein with reference to FIGS. 2A, 2B and 3. It is understood, however, that embodiments in accordance with the invention are suitable for depositing dielectric material in a wide range of high aspect ratio gaps in a wide range of applications using a suitable HDP-CVD system during integrated circuit fabrication. In processes 410, a substrate 202 having a gap 214 is placed or brought into a vacuum chamber 304. In some embodiments, the substrate enters the chamber at a time when a plasma is being sustained inside the chamber by either only LFRF or MFRF or by both. This plasma is generally referred to as a transfer (idle) plasma, typically comprising combinations of He, $O_2$, Ar, $H_2$, the choice of which is process application-dependent. During HDP-CVD deposition, the pressure of the vacuum chamber is maintained at a pressure in a range of about from 0.1 milli-Torr (mTorr) to 100 mTorr, typically in a range of 5 mTorr to 15 mTorr. The temperature in the vacuum chamber is maintained in a range of 0° C. to 200° C., typically at about 50° C. The substrate temperature is generally in a range typical in HDP-CVD processes, that is, in a range of about from 200° C. to 1000° C. To control substrate temperature, a heat transfer gas, such as helium, is supplied through a gas line (not shown) between the surface of the substrate and the surface of substrate holder 316 to the backside of the substrate.

Processes 420 include providing a process gas containing dielectric-forming constituents. Thus, a process gas for forming silicon oxide includes gaseous precursor molecules containing silicon, Si, and oxygen atoms. Precursors used in HDP-CVD techniques to form silicon oxides are well known in the art. In some embodiments, no reactive oxygen species are fed into the vacuum chamber, rather oxygen atoms for providing the oxygen of the silicon oxide material to be deposited are contained in one or more precursor compounds. U.S. Pat. No. 6,376,391, issued Apr. 23, 2002, to Olson et al., which is incorporated by reference, teaches an exemplary method for depositing a thin film of low-k dielectric material without including an oxidizing reactant in the process gas. Generally, however, the process gas includes an oxidizing reactant. Examples of suitable silicon-containing precursor molecules include, among others: silane ($SiH_4$), disilane ($Si_2H_6$), TES (tri-ethoxy silane), TEOS (tetraethoxysilane, or tetraethyl orthosilicate), TMCTS (tetramethyl-cyclotetrasiloxane), OMCTS (octamethyl-cyclotetrasiloxane), methylsilane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and excited plasma-phase species, which then react on the surface of the substrate. Suitable oxidizing gas reactants include, among others: oxygen gas ($O_2$), ozone ($O_3$), steam ($H_2O$), nitrous oxide ($N_2O$), nitrogen dioxide ($NO_2$) and carbon dioxide ($CO_2$). In some embodiments, the process gas includes precursor molecules that contain one or more types of atoms such as carbon, fluorine, phosphorus, boron and others for making doped silicate glass, such as SiOC, FSG (fluorosilicate glass), PSG (phophosilicate glass), and BSG (borosilicate glass), among others. In some embodiments, a liquid precursor is gasified into an inert carrier gas, typically helium. In some embodiments, one or more gaseous precursors for forming dielectric material are mixed with a carrier gas. In preferred embodiments, the process gas includes a relatively inert plasma-forming gas. Noble gases, such as helium, neon, argon and xenon, are suitable inert plasma-forming gases. Helium and argon are commonly used in HDP-CVD processes. In some embodiments, helium is preferred because it is lighter than argon and is, therefore, less prone to damage equipment or substrates while in an excited state. In accordance with the invention, the process gas includes one or more types of gaseous molecules from which plasma discharge creates substantially inert positive ions that sputter deposited dielectric material during deposition operations. Often, a single type of gaseous molecule, such as helium (He), functions as a carrier gas, a plasma-forming gas, and a source of positive sputtering ions.

Processes 430 include providing plasma discharge to create excited species from the process gas. As depicted in FIG. 3, in system 302, LF-RF power and MF-RF power are inductively applied through LF coils 310 and MF coils 308 to the process gas to generate a high-density plasma. The resulting plasma discharge creates excited species from the process gas, including radicals, negative ions and positive ions. In HDP-CVD deposition processes, excited dielectric-forming species diffuse to the substrate surface and react to form a desired dielectric material. In embodiments in accordance with the invention operable to process a 300 mm integrated circuit wafer, the total power of LF and MF HF sources is generally in the range of about from 700 watts (W) to 20 kilowatts (kW) and typically in the range of about from 800 W to 20 kW. In preferred embodiments, the LF power is greater than the MF power. Some embodiments include only a single LF-RF power source. Other embodiments include dual LF-RF power sources for generating plasma. It is understood that techniques and systems different from those described herein are suitable for generating and/or sustaining a plasma in accordance with the invention.

Processes 440 include applying pulsed bias to the substrate. Generally, HDP-CVD deposition techniques include applying a bias to the substrate. Positive ions generated by ionization of gas molecules in the high-density plasma, for example, helium or argon ions, accelerate toward the substrate surface. The positive ions then strike the substrate surface to sputter some of the deposited dielectric material from the substrate surface. In contrast to conventional HDP-CVD techniques, however, in embodiments in accordance with the invention, a pulsed bias is applied to the substrate. In embodiments depositing dielectric material on a 300 mm wafer, HF-RF bias energy is applied to the substrate wafer at a power typically in a range of about from 500 W to 15 kW. The HF pulse frequency generally is in a range of about from 150 Hz to 50 kHz, more typically in a range of about from 500 Hz to 20 kHz. The duty cycle of HF pulses generally is in a range of about from 0.1 to 0.95, more typically in a range of about from 0.6 to 0.9. With an exemplary pulse frequency of 1 kHz, a pulse bias has a pulse width of 1 milli-second (msec), or 1000 microseconds (μs). Accordingly, with a duty cycle of 0.6, exemplary pulse bias is on for 600 μs and off for 400 μs per HF-RF pulse.

A set of representative ranges of operating variables and conditions for generating an exemplary Si—O-containing plasma in processes 430 and for both depositing ans sputtering $SiO_2$ in gap 214 in processes 440 in accordance with the invention is presented here. The flow rates and operating parameters listed are valid for a Novellus dual-source "SPEED-NexT" HDP-CVD module to deposit SiO on 300 mm semiconductor wafers. The free volume of the vacuum chamber is about 90~110 liters. It is understood that the flow rates (standard vapor and pressure) and power levels listed here would require modification for a different-sized vacuum chamber or wafer.

| | |
|---|---|
| $SiH_4$: | 5-300 sccm |
| $O_2$: | 25-1500 sccm |
| He: | 100-1000 sccm |
| $H_2$: | 50-2000 sccm |
| LF-RF: | 1300 W-8000 W |
| MF-RF: | 900 W-5000 W |
| HF-RF: | 500 W-7500 W |
| Chamber Pressure: | 1 mTorr-15 mTorr |
| Chamber Temperature: | 200° C.-500° C. |
| Substrate Temperature: | 400° C.-800° C. |

Generally, a plasma sheath is a non-neutral layer located where a plasma contacts a material surface. In a plasma, the electrons usually have a temperature on the order of or greater than that of the ions and are much lighter. Consequently, they travel faster than the ions. At the interface to a material surface, therefore, the electrons fly out of the plasma, charging the surface negative relative to the bulk plasma. Thus, in HDP-CVD, the surface of a substrate wafer is negatively charged. Electrons are thereafter repelled from the negative substrate surface, while positive ions are drawn towards it. At the substrate surface, therefore, there is a plasma sheath containing only positive ions and neutral atoms. Impacts of positive ions drawn from the plasma through the plasma sheath towards the negatively charged substrate cause sputtering of dielectric material deposited on the substrate surface. As described above in the Background, some of the dielectric material sputtered from the bottom and side walls of a high aspect ratio gap during HDP-CVD typically re-deposits within the gap, often causing overhangs at the top of the gap and premature closing of the gap opening before the gap is completely filled with good quality dielectric material.

Application of a pulsed bias to a substrate during HDP-CVD in accordance with the invention inhibits or prevents re-deposition of sputtered dielectric material within a gap, thereby avoiding or preventing the formation of overhangs and the premature closing of the gap opening. The result is good, complete bottom filling of the gap with good quality dielectric material without voids and weak spots.

Without being bound to any particular theory, it is believed that some of the sputtered dielectric material re-deposits during HDP-CVD on the inside walls of a gap and at or near the top of a gap as a result of the net negative charge of the substrate surface, including the inside walls of the gap. It is generally accepted that physical sputtering of dielectric material in the gap is directional, or anisotropic, tending to sputter the bottom of a gap selectively over the side walls of a gap. It is believed that dielectric material sputtered from inside the gap initially is located in the empty plasma-filled space within the gap. As positive ions within the empty space accelerate toward the negatively charged surface, they collide with the dielectric material, change direction, and carry some of the sputtered dielectric material to an inside wall of the gap. It is also believed that the sputtering positive ions impart some degree of positive charge to some of the sputtered dielectric material. Thereafter, the pieces of positively charged sputtered dielectric material are attracted by the negatively charged surfaces within the gap and re-deposit within the gap. Without being bound to any particular theory, it is believed that a bias applied to a wafer substrate in a pulse-like manner during at least a portion of a HDP-CVD deposition process interrupts the usual sequence of attraction of ions, sputtering and re-deposition, thereby inhibiting or preventing re-deposition of sputtered dielectric material within the gap. During the off time, "non-duty cycle", of a bias pulse, the negative charge of the substrate dissipates, so there is no attraction of positive ions from the plasma to the substrate. As a result, there is no sputtering of dielectric material during a non-duty cycle. Furthermore, sputtered dielectric material within the empty space inside a gap is not pushed by positive ions toward the surface because positive ions are not being attracted to the surface. Pulsed bias causes the ions traversing the sheath to lose momentarily direction owing to a lack of bias voltage. This inhibits or prevents sputtered material from re-depositing along the line of sight. Also, any sputtered dielectric material carrying some degree of positive charge is not attracted to the surface during a non-duty cycle. Instead, sputtered dielectric material momentarily in the empty space during a non-duty cycle diffuses out of the gap or is drawn by the suction of the vacuum pump out of the gap.

Processes 450 include continuing steps 420-440 until the gap is filled satisfactorily with dielectric material. In some embodiments, pulse bias in accordance with the invention is applied only during a portion of the total duration of HDP-CVD deposition of dielectric material to fill a gap. In other words, in some embodiments, a continuous bias is applied in a conventional manner to the substrate during a portion of the total duration of HDP-CVD deposition of dielectric material, and pulsed bias is applied during another portion or portions of the total duration of deposition processes required to completely fill the gap. In other embodiments, pulse bias in accordance with the invention is applied during substantially the total duration of HDP-CVD deposition of dielectric material to fill a gap. Also, in some embodiments, pulse duty cycle in accordance with the invention is varied during deposition of dielectric material in a gap. For example, in some embodiments, the duty cycle is decreased gradually or step-wise during the course of deposition from a high value (e.g., 0.99 or 0.9) to a lower value (e.g., 0.5) as the gap gradually fills and re-deposition becomes a more acute problem. In some embodiments, the power level of the pulsed bias is increased or decreased as filling of the gap with dielectric material progresses. For example, in some embodiments, the power level is increased as the gap becomes more filled, while the duty cycle decreases. In some embodiments, the pulse frequency is varied by increasing or decreasing the frequency as filling of the gap progresses.

Some embodiments in accordance with the invention include treating the substrate with a $H_2$-based plasma before each of the plurality of HDP-CVD deposition stages. An HDP-CVD deposition stage generally includes deposition of dielectric material by reaction of excited species at the substrate surface accompanied by simultaneous sputtering of deposited dielectric material from the substrate surface. Co-owned and copending U.S. patent application Ser. No. 11/082,369, filed Mar. 16, 2005, by Shanker et al., which is hereby incorporated by reference as if fully contained herein, teaches a method of filling a gap with dielectric material by conducting a plurality of treatment and deposition sequences, each sequence including treating a substrate with $H_2$-based plasma followed by an HDP-CVD deposition stage. Some embodiments of a method taught in U.S. patent application Ser. No. 11/082,369 also include etching the substrate surface with fluorine plasma between sequences.

An HDP-CVD deposition stage in accordance with the invention generally includes deposition of dielectric material in a gap by reaction of excited species at the substrate surface accompanied by simultaneous sputtering of deposited dielectric material in the gap. Some embodiments in accordance with the invention include one or more sequences of a deposition stage followed by a separate etch stage. In some embodiments, an etch stage is characterized by an etch plasma containing an etching species, but not containing sufficient dielectric-forming species to deposit dielectric material. In some embodiments, however, an etch-stage plasma also includes dielectric-forming species. Typically, an etch plasma comprises chemical, or reactive, etching species. In some embodiments, however, an etch gas includes physical etching species, but no chemical etching species. In some embodiments comprising one or more sequences of a deposition stage followed by an etch stage, pulsed bias is applied to the substrate during at least a portion of at least one deposition stage, but pulsed bias is not necessarily applied to the substrate during etch stages. In some embodiments comprising one or more sequences of a deposition stage followed by an etch stage, pulsed bias is applied to the substrate during at least a portion of at least one etch stage, but pulsed bias is not necessarily applied to the substrate during deposition stages. Typically, however, in embodiments comprising one or more sequences of a deposition stage followed by an etch stage, pulsed bias is applied to the substrate during at least a portion of at least one deposition stage, and pulsed bias is applied to the substrate during at least a portion of at least one etch stage. In some embodiments, pulsed bias is applied to the substrate during substantially the total duration of both deposition stages and etch stages.

Pulse bias is useful in an etch stage to decouple anisotropic (directional) physical sputtering from substantially isotropic reactive, or chemical, etching.

Figure 5A:
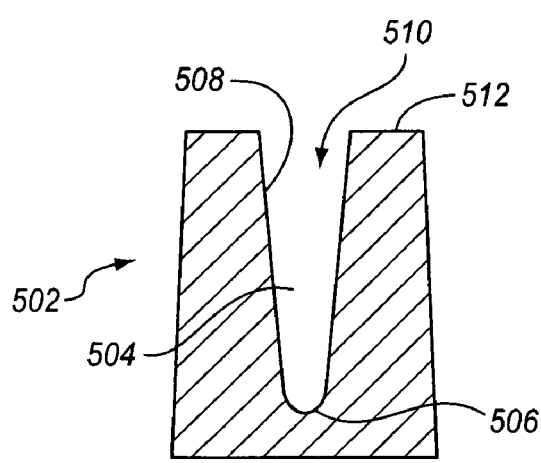
FIGS. 5A-5D depict schematically cross-sectional diagrams of an integrated circuit substrate having a high AR gap at different intermediate phases of a multi-step, etch-enhanced gap fill process in accordance with the present invention.

FIGS. 5A-5D depict schematically cross-sectional diagrams of an integrated circuit substrate having a high AR gap at different intermediate phases of a multi-step, etch-enhanced gap fill process in accordance with the present invention. FIG. 5A depicts a semiconductor substrate 502 having a trench (gap) 504 to be filled with dielectric material. The gap may be defined by its features, namely its bottom 506, sidewalls 508 and entry region (top) 510. Gap 504 is generally lined with a barrier layer (not shown), such as thermal silicon dioxide ($SiO_2$) and ($Si_3N_4$) silicon nitride. For example, a single layer of silicon dioxide (e.g., in a range of about from 10 Å to 200 Å) is formed on gap bottom 506 and sidewalls 508 prior to gap filling with bulk dielectric. A pad nitride also generally exists at the entry region 510, on the substrate field areas surrounding gap 504.

The present invention, while applicable to the filling of any gap requiring dielectric fill, is particularly suited to gap filling of high aspect ratio, narrow width gaps. For example, in some embodiments, gap 504 has a high aspect ratio, for example about 6:1, and a narrow width, for example, about 50 nm.

Figure 5B:
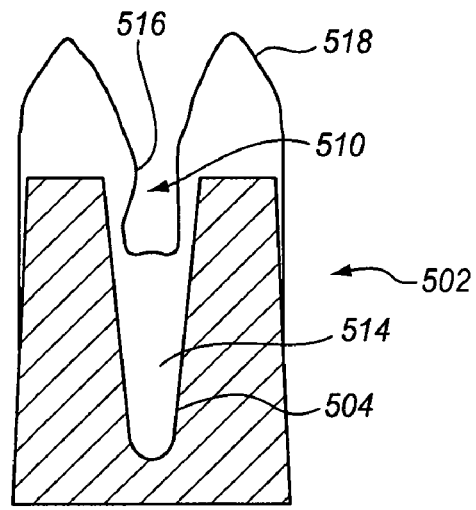

In an initial deposition step in a multi-step gap fill process in accordance with the present invention, gap 504 is partially filled with a dielectric 514 deposited by HDP-CVD, as depicted in FIG. 5B. The HDP-CVD deposition results in beneficial filling of the trench from the bottom 506 upwards. Nevertheless, some problematic top and sidewall deposition causes formation of an overhang 516 and formation of a dielectric peak ("top-hat") 518 on either side of gap opening 510. As a result, there is a narrowing of the entry region 510 of gap 504. Formation of overhang 516 and top hats 518 typically is a result of non-directional deposition reactions of neutral species in the plasma vacuum chamber and from sputtering/re-deposition phenomena. Overhang 516 and top-hats 518 exacerbate the difficulties of filling high AR gap 504.

Figure 5C:
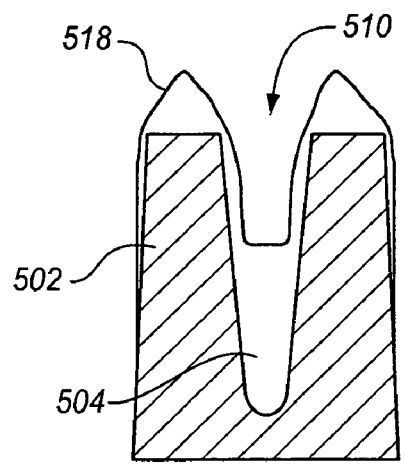
Figure 5D:
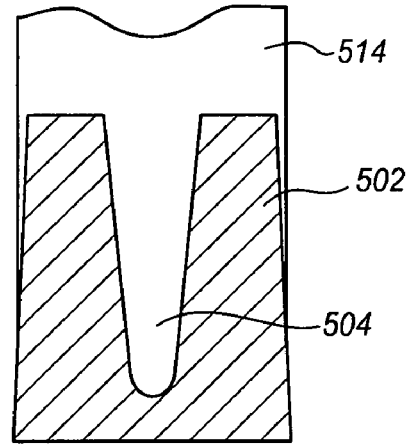

To address these problems, following the initial deposition stage of the process, an etch back stage is conducted. An etch stage typically includes, but does not necessarily include, chemical (or reactive) etching of the substrate surface. Chemical etching is usually substantially isotropic. An etch stage also typically includes sputter etching using pulsed bias in accordance with the invention. As depicted in FIG. 5C, removal of dielectric material in the next stage in accordance with the invention resulted in substantial removal of overhangs at top 510 of gap 504 and in substantial diminution of top hats 518 on substrate 502. As depicted in FIG. 5D, a further HDP-CVD deposition step results in complete filling of gap 504 with dielectric material 514. Alternatively, the sequence of deposition followed by chemical etching is repeated one or more times in order to fill gap 504 completely with dielectric material. In a preferred embodiment, the etch back process is carried out in the same vacuum chamber as the deposition.

FIG. 6 contains a process flow diagram of an embodiment of a generalized method 600 in accordance with the invention for depositing a dielectric material in a high aspect ratio gap of an integrated circuit substrate using a sequence including HDP-CVD deposition followed by an etch stage including chemical etching. Such a process is sometimes referred to as a "dep-etch-dep" process. Method 600 is described herein with reference to FIGS. 5A-5D. It is understood, however, that embodiments in accordance with the invention are suitable for depositing dielectric material in a wide range of high aspect ratio gaps in a wide range of applications using a suitable HDP-CVD and etching equipment during integrated circuit fabrication. In processes 610, a substrate 502 having a gap 504 is placed in a vacuum chamber. Typically, the substrate enters the chamber at a time when a plasma is being sustained inside the chamber by either only LFRF or MFRF or by both. This plasma is referred to as a transfer (idle) plasma comprising combinations of He, $O_2$, Ar, $H_2$, the choice of which is dependent on the particular process application. Processes 620 include providing a deposition gas including dielectric-forming constituents. Processes 630 include providing a process plasma discharge to create excited species from molecules contained in the deposition gas. Depending on gap geometry, substrate composition, dielectric material composition and other relevant factors, the process gas composition and HDP-CVD operating conditions are selected as explained above with reference to FIG. 4 regarding HDP-CVD deposition in generalized method 400. Processes 640 include applying pulsed bias to substrate 502, resulting in deposition of dielectric material in gap 504 and field areas 512 of substrate 502 and simultaneous sputtering of dielectric material from substrate 502. After partial filling of gap 504 in an initial HDP-CVD deposition stage (processes 620, 630, 640), an etching stage is performed. Typically, the etching stage comprises chemical etching. Nevertheless, in some embodiments, an etch gas does not include a chemical etchant (e.g., a halogen-containing gas), but rather includes only physical etching species (e.g., helium). In some embodiments, the etch gas and the vacuum chamber do not include sufficient dielectric-forming species to deposit dielectric material during an etch stage. In some embodiments, however, both deposition gases and chemical etching gases (e.g., a fluorine-based etch gas) are used simultaneously.

Typically, etching is conducted in the same vacuum chamber in which HDP-CVD deposition is conducted, usually without transfer of the substrate from a substrate holder. In the embodiment of method 600, processes 650 include providing an etch gas including chemical etching species, and also include discontinuing the flow of one or more precursors used for forming dielectric material. In some embodiments, basically the same process gas used during HDP-CVD deposition (processes 620, 630, 640) is used during chemical etching, except that the etch process gas includes one or more types of molecules to provide excited chemical (reactive) etching species when subjected to plasma discharge, and the etch process gas does not include sufficient dielectric precursor molecules to form excited dielectric-forming species when subjected to plasma discharge. Typically, the etch process gas also includes an inert gas that provides excited species for physical sputtering of dielectric material on the substrate surface simultaneous with chemical etching of dielectric material.

Commonly, a halogen-containing compound is used in plasma etching techniques in accordance with the invention. Suitable fluorine-containing compounds include, among others: $NF_3$, $SF_3$, $CF_4$, and $C_2F_6$. U.S. Pat. No. 6,030,881, issued Feb. 29, 2000, to Papasoulitis et al., which is hereby incorporated by reference, teaches HDP-CVD deposition followed by chemical etching using a fluorine-containing compound in the etch process gas. In some embodiments in accordance with the invention, a halogen-containing gas or other chemical etching species is not included in the etch process gas. Co-owned and co-pending U.S. patent application Ser. No. 11/159,834, filed Jun. 22, 2005, by Lang et al., which is hereby incorporated by reference as if fully contained herein, teaches a HDP-CVD deposition-etch-deposition method in which isotropic etching in a reactive etching step is helium-based.

Processes 660 include providing plasma discharge to create excited species from the etch process gas. Excited chemical etching species diffuse to the substrate surface and into the gap, resulting in chemical etching of dielectric material.

Processes 670 include applying pulse bias to the substrate at least during a portion of an etch stage. Pulse bias is useful in an etch stage to decouple anisotropic (directional) physical sputtering from substantially isotropic reactive, or chemical, etching.

A set of representative ranges of operating variables and conditions for generating an exemplary F-containing plasma in processes 660, and simultaneously sputtering and chemical-etching in processes 670 in accordance with the invention is presented here. The flow rates and operating parameters listed are valid for a Novellus "SPEED" HDP-CVD module to sputter and etch $SiO_2$ on 300 mm semiconductor wafers. The free volume of the vacuum chamber is about 90 to 110 liters. It is understood that the flow rates (standard vapor and pressure) and power levels listed here would require modification for a different-sized vacuum chamber or wafer.

| | |
|---|---|
| $SiH_4$: | 0 sccm |
| $O_2$: | 0 sccm |
| $NF_3$: | 10-1000 sccm |
| He: | 100-1000 sccm |
| $H_2$: | 200-1200 sccm |
| LF-RF: | 1300 W-4000 W |
| MF-RF: | 900 W-5000 W |
| HF-RF: | 500 W-5000 W |
| Chamber Pressure: | 1 mTorr-15 mTorr |
| Chamber Temperature: | 200° C.-500° C. |
| Substrate Temperature: | 400° C.-800° C. |

In the biased etch back stage, the wafer is biased and exposed to a plasma. As shown in FIG. 5C, there is partial removal of deposited dielectric film, primarily in the overhang and top-hat areas at the top of the gap. The efficiency of the etch is increased and or controlled by pulse biasing the substrate, and the etch rate increases with the bias power. This combination of anisotropic pulsed sputtering and substantially isotropic chemical etching leads to efficient removal of unnecessary deposition at and adjacent to the gap opening in order to maintain the gap open enough for a complete gap fill in one or more subsequent HDP-CVD deposition stage(s) of the multi-step process.

Generally, the chuck is biased with a power in a range of about from 500 W to 5000 W. Biasing the chuck imparts some directionality to the etch plasma towards the wafer on the biased chuck. Thus, while the etch process has a dominant isotropic character, it favors a biased wafer/chuck. Increase in bias power enhances etch rate, but does not significantly alter the isotropic characteristic of the chemical etch. This is observed as a conservation of bottom-up deposition even with high bias power applied during etch processing.

The conditions are preferably set so that the etch is selective for the HDP-CVD deposited dielectric (e.g., $SiO_2$) relative to underlying substrate materials (e.g., silicon nitride barrier layer lining the trench and the hard mask (e.g., pad nitride on the substrate surface surrounding the gap opening)) so that neither is exposed and clipped by the etch. Adjustment of the process selectivity is within the skill in the art given the process parameters and description provided herein.

After conducting an initial etching stage (processes 650, 660, 670), substrate (FIG. 5C) is usually ready for further HDP-CVD deposition (processes 620, 630, 640). Processes 680 include repeating deposition and etch stages (processes 620-670) until gap 504 is completely filled (FIG. 5D).

EXAMPLE 1

Using a HDP-CVD process including pulse HF biasing of the substrate in accordance with the invention, partial bottom filling of high AR trenches (gaps) with silicon dioxide ($SiO_2$) dielectric material was conducted with various pulse duty cycle values on a series of semiconductor substrates.

HDP-CVD deposition processes began by placement of a standard 300 mm semiconductor wafer having high AR trenches on the pedestal of a "SPEED-NexT" HDP-CVD module, commercially available from Novellus Systems, Inc., San Jose, Calif. The trenches had a depth of about 447 nm and a width of 144 nm.

The process gas compositions and flowrates and HDP-CVD operating conditions were as follows:

| | |
|---|---|
| $SiH_4$: | 50-120 sccm |
| $O_2$: | 100-600 sccm |
| He: | 200-500 sccm |
| $H_2$: | 250-500 sccm |
| LF-RF: | 5000 W-8000 W |
| MF-RF: | 3000 W-5000 W |
| HF-RF: | 3500 W-5500 W |
| Chamber Pressure: | approx. 5 mTorr |
| Chamber Temperature: | approx. 200° C. |
| Substrate Temperature: | approx. 550° C.-700° C. |
| Nominal pedestal height: | 1.5-4 |
| Pulse frequency: | 1 kHz |

HDP-CVD deposition was conducted on each of the series of substrates for about 45 seconds to achieve partial filling of the trenches (gaps), and the duty cycle of the pulse bias was varied between substrates. HDP-CVD deposition was conducted on each of six substrates, using the following pulse duty cycle values: 1.0 (i.e., conventional bias with no pulse), 0.9, 0.7, 0.5, 0.3 and 0.1.

Figure 7A:
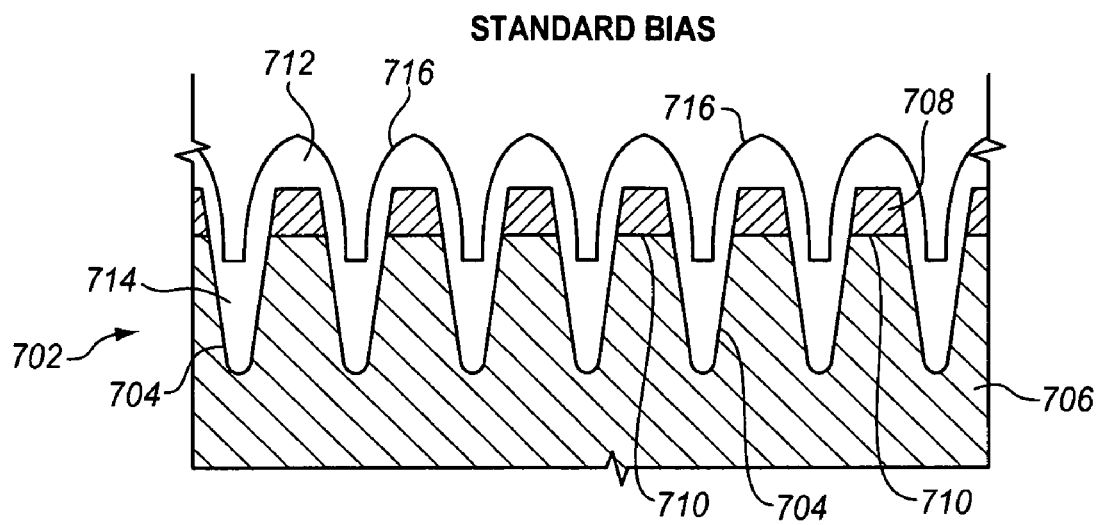
FIG. 7A depicts schematically the results of HDP-CVD deposition using standard, conventional continuous HF bias.

FIG. 7A depicts schematically the results of the HDP-CVD deposition using standard, conventional continuous HF bias (i.e., duty cycle of 1.0). FIG. 7A depicts a cross-sectional view of substrate 702 having trenches 704 in polycrystalline silicon layer 706. Substrate 702 also includes silicon nitride (SiN) 708 having a thickness of about 70 nm located on field areas 710 of semiconductor base layer 706. The trenches had a depth of about 447 nm measured from the top of the silicon nitride. Following HDP-CVD deposition, deposited dielectric material (silicon dioxide) partially filled trenches 704 and covered silica nitride 708. The measured thickness of the deposited dielectric in the trenches was approximately 227 nm, while the measured thickness of top hats 716 above silicon nitride 708 was about 152 nm.

Figure 7B:
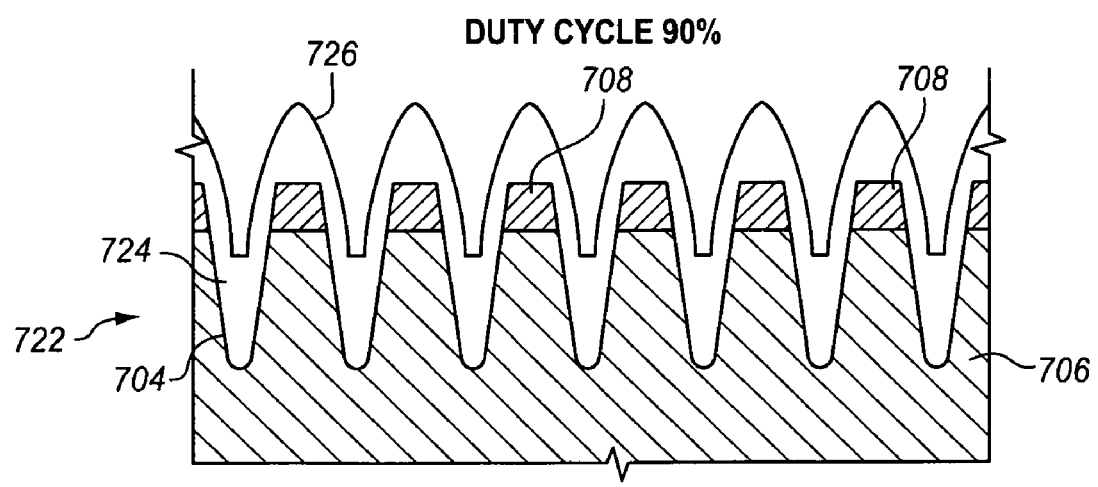
FIG. 7B depicts schematically the results of HDP-CVD deposition using pulse HF bias with a duty cycle of 0.9.

FIG. 7B depicts schematically the results of the HDP-CVD deposition using pulse HF bias with a duty cycle of 0.9. The measured thickness of the deposited dielectric 722 in trenches 704 of substrate 722 was approximately 227 nm, while the measured thickness of top hats 726 above silicon nitride 708 was about 205 nm.

Figure 7C:
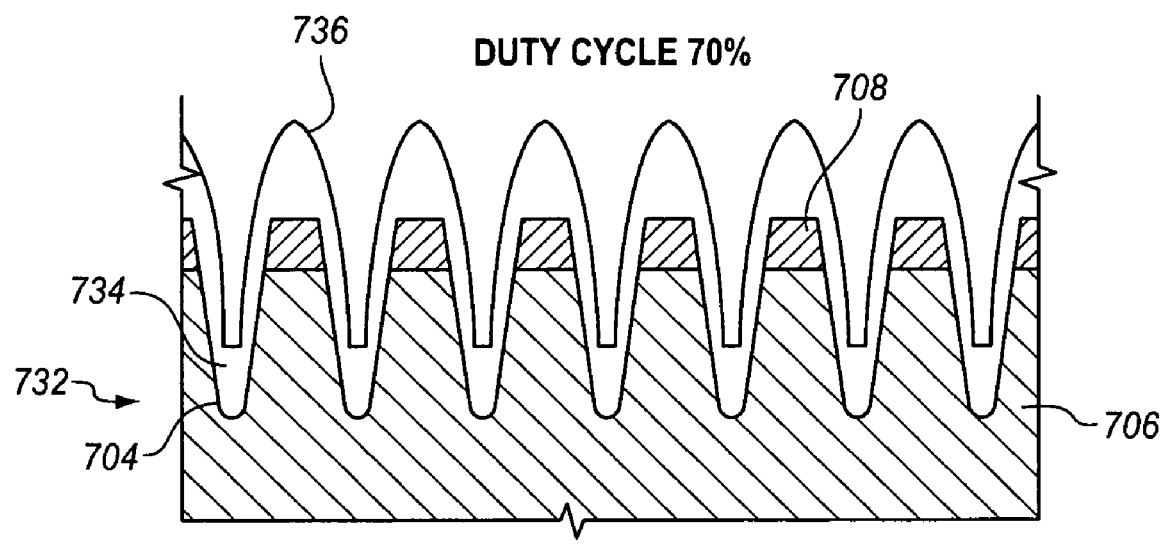
FIG. 7C depicts schematically the results of HDP-CVD deposition using pulse HF bias with a duty cycle of 0.7.

FIG. 7C depicts schematically the results of the HDP-CVD deposition using pulse HF bias with a duty cycle of 0.7. The measured thickness of the deposited dielectric 734 in trenches 704 of substrate 732 was approximately 189 nm, while the measured thickness of top hats 736 above silicon nitride 708 was about 215 nm.

Figure 7D:
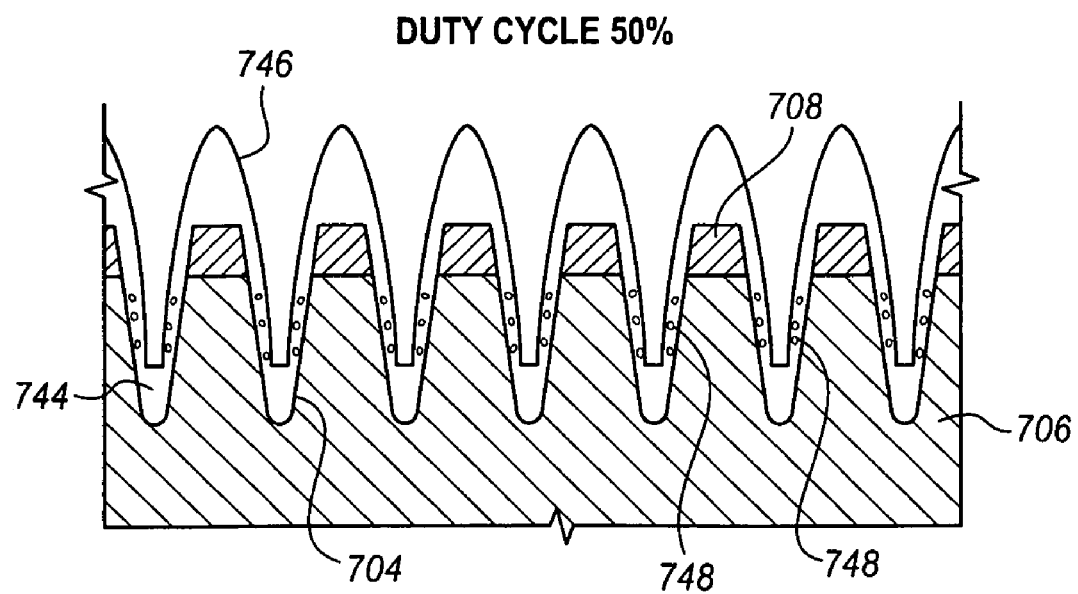
FIG. 7D depicts schematically the results of HDP-CVD deposition using pulse HF bias with a duty cycle of 0.5.

FIG. 7D depicts schematically the results of the HDP-CVD deposition using pulse HF bias with a duty cycle of 0.5. The measured thickness of the deposited dielectric 744 in trenches 704 of substrate 742 was approximately 167 nm, while the measured thickness of top hats 746 above silicon nitride 708 was about 212 nm. Deposited dielectric material 744 in trenches 704 contained numerous weak spots 748.

Figure 7E:
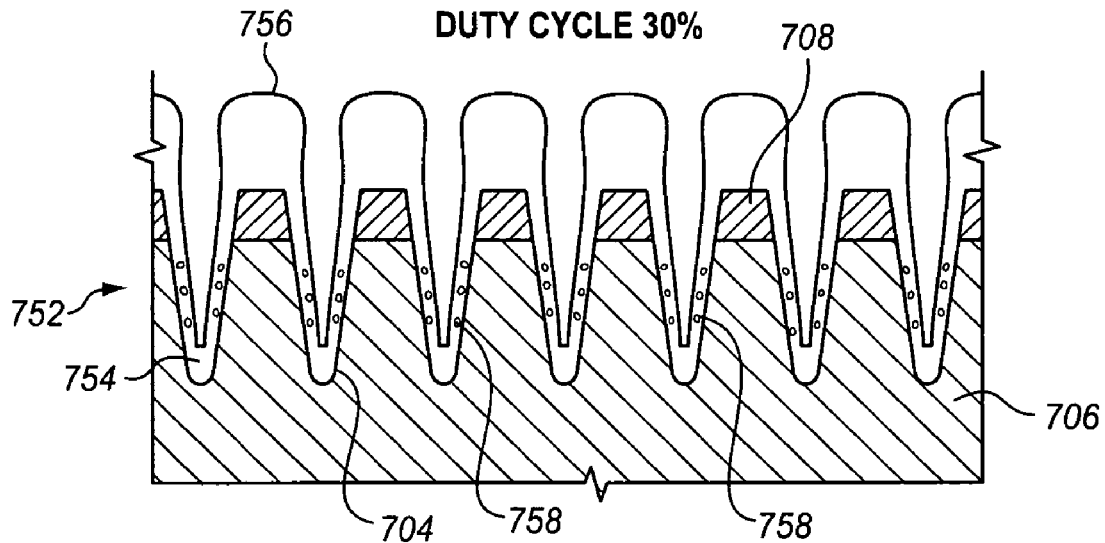
FIG. 7E depicts schematically the results of HDP-CVD deposition using pulse HF bias with a duty cycle of 0.3.

FIG. 7E depicts schematically the results of the HDP-CVD deposition using pulse HF bias with a duty cycle of 0.3. The measured thickness of the deposited dielectric 754 in trenches 704 of substrate 752 was approximately 91 nm, while the measured thickness of top hats 756 above silicon nitride 708 was about 227 nm. Deposited dielectric material 754 in trenches 704 contained numerous weak spots 758.

Figure 7F:
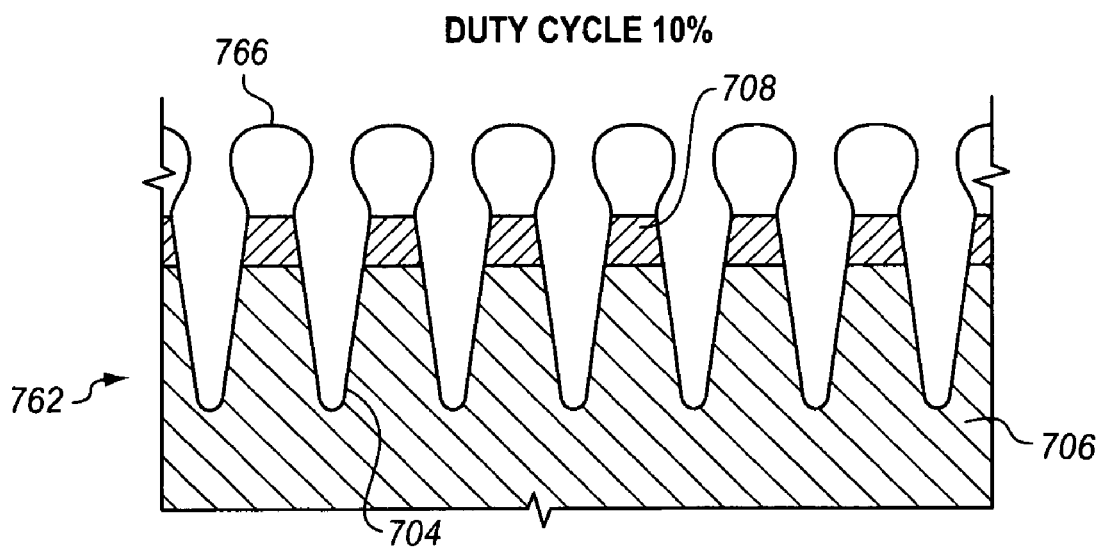
FIG. 7F depicts schematically the results of HDP-CVD deposition using pulse HF bias with a duty cycle of 0.1.

FIG. 7F depicts schematically the results of the HDP-CVD deposition using pulse HF bias with a duty cycle of 0.1. The thickness of the deposited dielectric in trenches 704 of substrate 762 was practically un-measurable. The measured thickness of top hats 766 above silicon nitride 708 was about 227 nm.

Comparison of the results and depicted in FIGS. 7A-7F indicates a decrease in the amount of bottom filling as duty cycle decreases, and generally an increase in top hat thickness as duty cycle decreases.

EXAMPLE 2

Using a HDP-CVD process including pulse HF biasing of the substrate in accordance with the invention, partial bottom filling of high AR trenches (gaps) with silicon dioxide ($SiO_2$) dielectric material was conducted on a series of semiconductor substrates with various combinations of pulse frequency and pulse duty cycle values.

HDP-CVD deposition processes began by placement of a standard 300 mm semiconductor wafer having high AR trenches on the pedestal of a "SPEED-NexT" HDP-CVD module, commercially available from Novellus Systems, Inc., San Jose, Calif. The trenches had a depth of about 220 nm and a width of 70 nm.

The process gas compositions and flowrates and HDP-CVD operating conditions were as follows:

| | |
|---|---|
| $SiH_4$: | 50-120 sccm |
| $O_2$: | 100-600 sccm |
| He: | 200-500 sccm |
| $H_2$: | 250-500 sccm |
| LF-RF: | 5000 W-8000 W |
| MF-RF: | 3000 W-5000 W |
| HF-RF: | 3500 W-5500 W |
| Chamber Pressure: | approx. 5 mTorr |
| Chamber Temperature: | approx. 200° C. |
| Substrate Temperature: | approx. 550° C.-700° C. |
| Nominal pedestal height: | 1.5-4 |
| Pulse frequency: | 1 kHz or 10 kHz |

HDP-CVD deposition was conducted on each of the series of substrates for about 45 seconds to achieve partial filling of the trenches (gaps), and the pulse frequency and duty cycle of the pulse bias were varied between substrates. HDP-CVD deposition was conducted on each of four substrates.

Figure 8A:
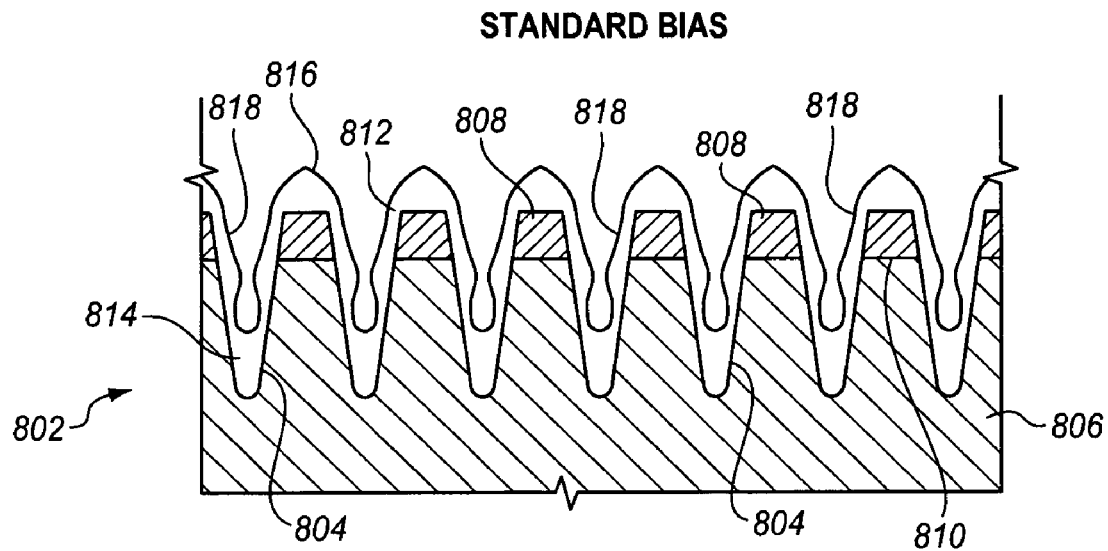
FIG. 8A depicts schematically the results of HDP-CVD deposition using standard, conventional continuous HF bias at a pulse frequency of 1 kHz.

FIG. 8A depicts schematically the results of the HDP-CVD deposition using standard, conventional continuous HF bias (i.e., duty cycle of 1.0) at a pulse frequency of 1 kHz. FIG. 8A depicts a cross-sectional view of substrate 802 having trenches 804 in polycrystalline silicon layer 806. Substrate 802 also includes silicon nitride (SiN) 808 located on field areas 810 of semiconductor base layer 806. The trenches had a depth of about 220 nm measured from the top of SiN 808. Following HDP-CVD deposition, deposited dielectric material (silicon dioxide) partially filled trenches 804 and covered silicon nitride 808. The deposited dielectric 812 partially filled trenches 804. The thickness of dielectric material 814 at the bottom of trenches 804 was comparable to the thickness of dielectric material of top hats 816. As depicted in FIG. 8A, the dielectric material formed overhangs 818 near the tops of trenches 804. It is clear that continued deposition of dielectric material under standard conditions without pulse bias would have resulted in formation of voids within the trenches.

Figure 8B:
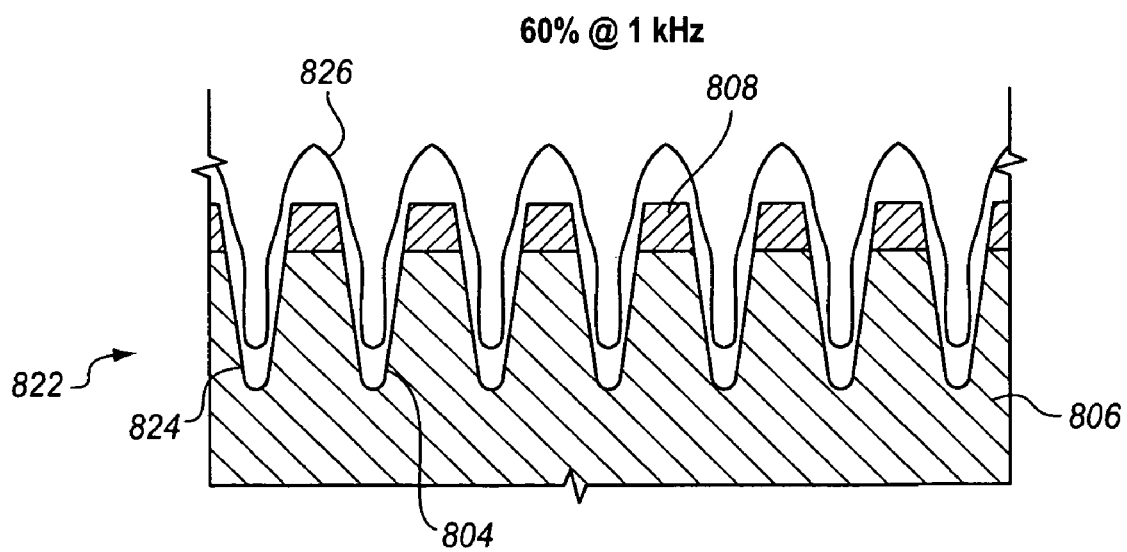
FIG. 8B depicts schematically the results of HDP-CVD deposition using pulse HF bias in accordance with the invention with a pulse duty cycle of 0.6 and a pulse frequency of 1 kHz.

FIG. 8B depicts schematically the results of the HDP-CVD deposition using pulse HF bias in accordance with the invention with a pulse duty cycle of 0.6 and a pulse frequency of 1 kHz. Following HDP-CVD deposition, deposited dielectric material (silicon dioxide) partially filled trenches 804 and covered silicon nitride 808. The thickness of dielectric material 824 at the bottom of trenches 804 was less than the thickness of dielectric material of top hats 826. Also, the thickness of dielectric material 824 at the bottom of trenches 804 was less than the thickness of dielectric material 814 that was deposited on substrate 802 using standard continuous HF bias (FIG. 8A). As depicted in FIG. 8B, however, and in contrast to the results depicted in FIG. 8A, the dielectric material formed substantially no overhangs near the tops of trenches 804 of substrate 822.

Figure 8C:
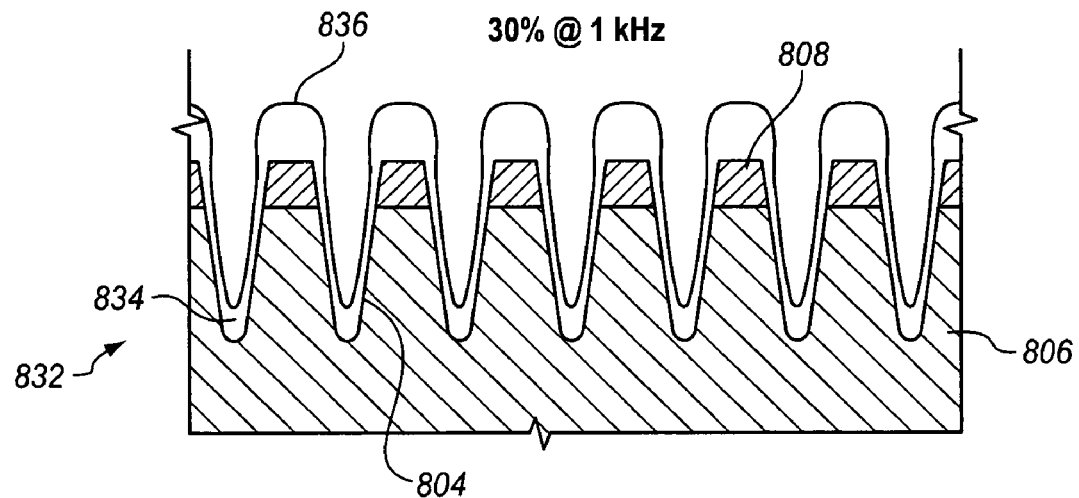
FIG. 8C depicts schematically the results of HDP-CVD deposition using pulse HF bias in accordance with the invention with a pulse duty cycle of 0.3 and a pulse frequency of 1 kHz.

FIG. 8C depicts schematically the results of the HDP-CVD deposition using pulse HF bias in accordance with the invention with a pulse duty cycle of 0.3 and a pulse frequency of 1 kHz. Following HDP-CVD deposition, deposited dielectric material (silicon dioxide) partially filled trenches 804 and covered silicon nitride 808 of substrate 832. The thickness of dielectric material 834 at the bottom of trenches 804 was less than the thickness of dielectric material of top hats 836. Also, the thickness of dielectric material 834 at the bottom of trenches 804 was less than the thickness of dielectric material 824 that was deposited on substrate 822 using pulse HF bias with a duty cycle of 0.6 (FIG. 8B). As depicted in FIG. 8C, the dielectric material formed substantially no overhangs near the tops of trenches 804 of substrate 832.

Figure 8D:
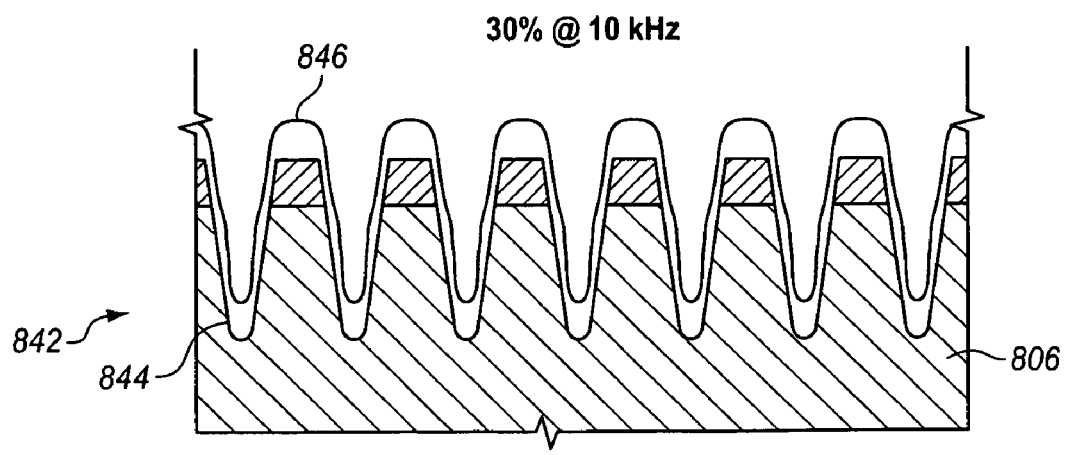
FIG. 8D depicts schematically the results of HDP-CVD deposition using pulse HF bias in accordance with the invention with a pulse duty cycle of 0.3 and a pulse frequency of 10 kHz.

FIG. 8D depicts schematically the results of the HDP-CVD deposition using pulse HF bias in accordance with the invention with a pulse duty cycle of 0.3 and a pulse frequency of 10 kHz. Following HDP-CVD deposition, deposited dielectric material (silicon dioxide) partially filled trenches 804 and covered silicon nitride 808 on substrate 842. The thickness of dielectric material 844 at the bottom of trenches 804 was less than the thickness of dielectric material of top hats 846. Also, the thickness of dielectric material 844 at the bottom of trenches 804 was less than the thickness of dielectric material 824 that was deposited on substrate 822 using pulse HF bias also with 0.3 duty cycle, but with a pulse frequency of 1 kHz (FIG. 8B). As depicted in FIG. 8D, the deposited dielectric material formed substantially no overhangs near the tops of trenches 804 of substrate 842.

Comparison of the results depicted in FIGS. 8A-8D indicates a decrease in the amount of bottom filling as duty cycle decreases, and generally an increase in top hat thickness as duty cycle decreases. Also, use of pulse HF bias in accordance with the invention reduces or prevents formation of overhangs of dielectric material during deposition. Comparison of the results of FIGS. 8C and 8D suggest that increasing the pulse frequency from 1 kHz decreases the overall deposition rate of dielectric material without negatively affecting deposition quality.

There has been described a novel method and precursors for bottom filling dielectric material in high AR gaps and trenches during integrated circuit fabrication. The novel method uses HDP-CVD deposition techniques, in which a pulsed bias is applied to an integrated circuit substrate during HDP deposition and etching operations. It should be understood that the particular embodiments shown in the drawings and described within this specification are for purposes of example and should not be construed to limit the invention, which will be described in the claims below. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Consequently, the invention is to be construed as embracing each and every novel feature and novel combination of features present in and/or possessed by the fabrication methods and compositions described.

What is claimed is:

1. In integrated circuit fabrication, a method for filling a gap with dielectric material by HDP-CVD, comprising:
   providing in a vacuum chamber a substrate containing a gap;
   providing a process gas including dielectric-forming constituents;
   providing a plasma discharge to create in said vacuum chamber excited species from said process gas;
   applying a bias to said substrate, thereby depositing dielectric material in said gap to fill partially said gap and simultaneously sputtering dielectric material in said gap;
   wherein said applying a bias comprises:
   applying a pulsed bias to said substrate, said pulsed bias having a pulse frequency not less than about 150 Hz, pulses of said pulsed bias having a duty cycle.

2. A method as in claim 1 wherein:
   said pulse frequency has a frequency in a range of about from 0.5 kHz to 20 kHz.

3. A method as in claim 1 wherein:
   duty cycles have a value in a range of about from 0.1 to 0.9.

4. A method as in claim 1 wherein:
   said pulsed bias comprises high-frequency radio frequency (HF-RF) bias.

5. A method as in claim 1 wherein:
   said gap has an aspect ratio greater than 3.

6. A method as in claim 1 wherein said providing a plasma discharge comprises:
   applying a substantially continuous radio frequency to a plasma-forming gas to generate a plasma.

7. In integrated circuit fabrication, a method for filling a gap with dielectric material by HDP-CVD, comprising:
   providing in a vacuum chamber a substrate containing a gap;
   in a deposition stage:
   providing a deposition gas including dielectric-forming constituents;
   providing a plasma discharge to create in said vacuum chamber excited species from said deposition gas; and
   applying a bias to said substrate, thereby depositing dielectric material in said gap to fill partially said gap and simultaneously sputtering dielectric material in said gap; and
   thereafter, in an etch stage:
   providing an etch gas;
   providing a plasma discharge to create excited species in said vacuum chamber from said etch gas, thereby etching a portion of dielectric material in said gap; and
   applying a bias to said substrate, thereby sputtering dielectric material in said gap;
   wherein said applying a bias in said deposition stage and in said etch stage comprises:
   applying a pulsed bias to said substrate, said pulsed bias having a pulse frequency not less than about 150 Hz, pulses of said pulsed bias having a duty cycle.

8. A method as in claim 7 wherein:
   said pulse frequency has a frequency in a range of about from 0.5 kHz to 20 kHz.

9. A method as in claim 7 wherein:
   duty cycles have a value in a range of about from 0.1 to 0.9.

10. A method as in claim 7 wherein:
    said pulsed bias comprises high-frequency radio frequency (HF-RF) bias.

11. A method as in claim 7, further comprising:
    repeating a deposition stage preceded by an etch stage until said gap is filled with dielectric material.

12. A method as in claim 7 wherein:
    said etch gas does not include components for substantially forming dielectric material.

13. A method as in claim 7 wherein:
    said etch gas comprises dielectric-forming constituents.

14. A method as in claim 7 wherein:
    said etch gas comprises components substantially for sputtering dielectric material; and
    said etch gas does not include a chemical etching species.

15. A method as in claim 1 wherein said process gas comprises:
    silicon atoms and oxygen atoms.

16. A method as in claim 15 wherein said process gas further comprises:
    hydrogen gas.

17. A method as in claim 15 wherein said process gas further comprises a noble gas.

18. A method as in claim 17 wherein said process gas further comprises a chemical etch gas.

19. A method as in claim 1 wherein:
    said gap has a gap width in a range of about from 30 nm to 50 nm.

20. A method as in claim 19 wherein:
    said gap has a gap depth in a range of about from 300 nm to 450 nm.

21. A method as in claim 7 wherein said deposition gas comprises:
    silicon atoms and oxygen atoms.

22. A method as in claim 21 wherein said deposition gas further comprises:
    hydrogen gas.

23. A method as in claim 21 wherein said deposition gas further comprises a noble gas.

24. A method as in claim 7 wherein said etch gas comprises:
    a chemical etching species; and
    components substantially for physically sputtering dielectric material.

25. A method as in claim 24 wherein:
    said etch gas comprises a halogen-containing compound.

26. A method as in claim 25 wherein:
    said etch gas comprises a fluorine-containing compound.

27. A method as in claim 24 wherein:
    said etch gas comprises a noble gas.

* * * * *